(12) United States Patent
Yao et al.

(10) Patent No.: US 6,703,322 B2
(45) Date of Patent: Mar. 9, 2004

(54) METHOD OF FORMING MULTIPLE OXIDE LAYERS WITH DIFFERENT THICKNESSES IN A LINEAR NITROGEN DOPING PROCESS

(75) Inventors: June-Min Yao, Hsin-Chu (TW); Cheng-Shun Chen, Hsin-Chu Hsien (TW); Shu-Ya Hsu, Yun-Lin Hsien (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 10/064,668

(22) Filed: Aug. 5, 2002

(65) Prior Publication Data

US 2004/0023512 A1 Feb. 5, 2004

(51) Int. Cl.$^7$ .................. H01L 21/31; H01L 21/469
(52) U.S. Cl. .................. 438/766; 438/770; 438/981
(58) Field of Search .................. 438/981, 766, 438/770, 258, 763, 275

(56) References Cited

U.S. PATENT DOCUMENTS 5,672,521 A * 9/1997 Barsan et al. ............... 438/276
6,358,865 B2 * 3/2002 Pearce et al. ............... 438/763

* cited by examiner

*Primary Examiner*—Richard A. Booth
(74) *Attorney, Agent, or Firm*—Winston Hsu

(57) ABSTRACT

Multiple oxide layers with different thicknesses are formed on a semiconductor substrate with a silicon surface, having a first and second region. A sacrificial oxide layer is formed on the silicon surface to cover both the first region and the second region, with a mask layer formed on the surface of the sacrificial oxide layer. By defining and patterning the mask layer, a first opening and a second opening, having predetermined surface areas, are formed in portions of the first and second regions of the mask layer to expose portions of the. The sacrificial oxide layer has a surface area equal to the first predetermined surface area, and portions of the sacrificial oxide layer having a surface area equal to the second predetermined surface area. A linear nitrogen doping process is then performed to simultaneously implant nitrogen ions with a first and second predetermined concentration into the first and second region, through the first opening and the second opening, respectively. Thereafter, the mask layer and the sacrificial oxide layer are removed, respectively. An oxidation process is performed to two silicon oxide layers with different thicknesses in the first and second regions.

7 Claims, 11 Drawing Sheets

METHOD OF FORMING MULTIPLE OXIDE LAYERS WITH DIFFERENT THICKNESSES IN A LINEAR NITROGEN DOPING PROCESS

BACKGROUND OF INVENTION

1. Field of the Invention

The present invention relates to a method of forming multiple oxide layers with different thicknesses simultaneously, and more specifically, to a method of forming multiple oxide layers with different thicknesses in a linear nitrogen doping process.

2. Description of the Prior Art

As the integration density of the chip increases and system-on-chip develops, multiple oxide layers with different thicknesses have become a critical element in integrated circuits so as to give a semiconductor device with multiple operating voltages. For a flash memory, the operating voltages of a memory cell and a peripheral circuit are 3.3 volts and 5 volts, respectively. Thus, both the channel length of the gate and the thickness of the gate oxide of the metal-oxide semiconductor (MOS) transistor in the peripheral circuit need to be greater than those of the MOS transistor in the memory cell so as to prevent electrical breakdown caused by a high voltage. Besides, multiple oxide layers with different thicknesses are normally needed in a read only memory (ROM).

There are multiple methods of forming oxide layers with different thicknesses. In 1993 Nakata et al. (U.S. Pat. No. 5,254,489) disclosed a method of forming two oxide layers with different thicknesses. Please refer to FIG. 1A to FIG. 1D of cross-section views of forming two oxide layers with different thicknesses disclosed by Nakata et al. In U.S. Pat. No. 5,254,489. As shown in FIG. 1A, a semiconductor substrate 1 comprises two areas, portions of the semiconductor substrate 1 in each area having a first oxide layer 3 atop, isolated by a dielectric layer 2. The first oxide layer 3 is normally formed by performing a dry oxidation process with pure oxygen supplied at a temperature of between 800 and 1150° C.

As shown in FIG. 1B, a nitridation process, with nitrogen supplied at a temperature ranging from 1000 to 1200° C. or with ammonia gas supplied at a temperature ranging from 900° C. to 1150° C., is then performed on the semiconductor substrate 1 to form a nitrided oxide layer 6. As shown in FIG. 1C, a photoresist layer 4 is employed to cover portions of the nitrided oxide layer 6. A hydrofluoric acid (HF) is then employed to remove portions of the nitrifled oxide layer 6 not covered by the photoresist layer 4 so as to expose portions of the surface of the semiconductor substrate 1. Finally, as shown in FIG. 1D, an oxidation process is performed to form an oxide layer 5 with a thickness greater than a thickness of the nitrided oxide layer 6 on the exposed surface of the semiconductor substrate 1 at the end of the method.

However, the photoresist layer 4 employed In the method of forming two oxide layers with different thicknesses disclosed by Nakata et al. can easily become contaminated leading to unstable quality of the oxide layers. In addition, the quality of the nitrided oxide layer 6 is worse than that of a pure silicon oxide layers. Besides, portions of the remaining nitrided oxide layer 6 covered by a mask layer during the formation of the oxide layer 5 are lightly oxidized during the oxidation process so as to lead to a defective thickness of the nitrided oxide layer 6. Most importantly the manufacturing processes, including two lithography processes, are complicated and not practical for manufacturing multiple gate oxide layers with more than three different thicknesses.

SUMMARY OF INVENTION

It is therefore a primary object of the present invention to provide a method of forming multiple oxide layers with different thicknesses quickly and reliably with a high yield rate in the process.

It is another object of the present invention to provide a method of forming multiple oxide layers with different precisely controlled thicknesses by performing only one linear nitrogen doping process and one oxidation process.

According to the claimed invention, a semiconductor substrate comprising a silicon surface, further comprising at least a first region and a second region is provided in a method of forming multiple oxide layers with different thicknesses. A sacrificial oxide layer is formed on the silicon surface to cover both the first region and the second region. A mask layer is then formed on the surface of the sacrificial oxide layer. By defining and patterning the mask layer, a first opening, having a first predetermined surface area ($A_1$), and multiple second openings, each having a second predetermined surface area ($A_2$), are respectively formed in portions of the mask layer within the first region and portions of the mask layer within the second region to expose portions of the sacrificial oxide layer having a surface area equal to the first predetermined surface area, and portions of the sacrificial oxide layer having a surface area equal to the second predetermined surface area, respectively. A linear nitrogen doping process is performed to simultaneously implant nitrogen ions with a first predetermined concentration($C_1$) and nitrogen ions with a second predetermined concentration($C_2$) into the first region and the second region, respectively, through the first opening and the second opening, respectively. The mask layer is then removed. Finally, the sacrificial oxide layer is removed and an oxidation process is performed to form a first silicon oxide layer, having a first predetermined thickness, and a second silicon oxide layer having a second predetermined thickness, in the first and second regions, respectively.

A ratio of the first predetermined surface area to the second predetermined surface area is defined as a constant k, obeying the following equation:

$$A_1/A_2 = k \times (C_1/C_2)$$

In the preferred embodiment of the present invention, the first predetermined surface area is greater than the second predetermined surface area, the first predetermined concentration is greater than the second predetermined concentration and the first predetermined thickness is less than the second predetermined thickness.

It is an advantage of the present invention against the prior art that only one nitrogen ion implantation process and one thermal oxidation process are needed to simultaneously form multiple gate oxide layers with different thicknesses. In addition, the different thicknesses of the multiple gate oxide layers can be precisely controlled. Most importantly, the quality of the gate oxide layer formed in the present invention Is better than that formed in the prior art, and the manufacturing processes are simplified. Consequently, the yield rate is efficiently improved and the manufacturing cost is significantly reduced.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1A:
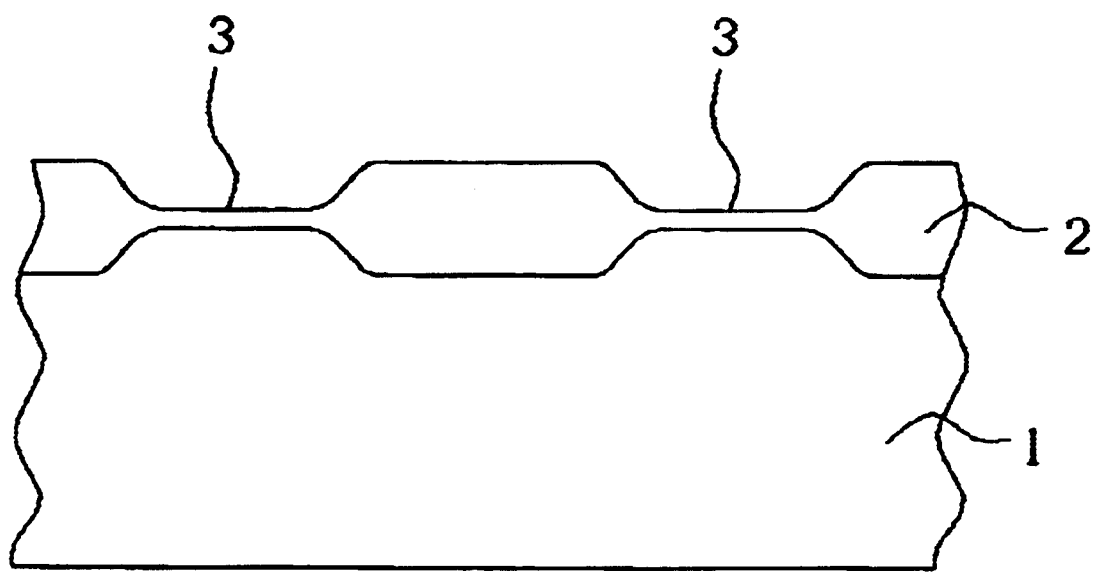
FIG. 1A to FIG. 1D are cross-sectional views of forming two oxide layers with different thickness disclosed by Nakata et al. In U.S. Pat. No. 5,254,489 in 1993.
Figure 1B:
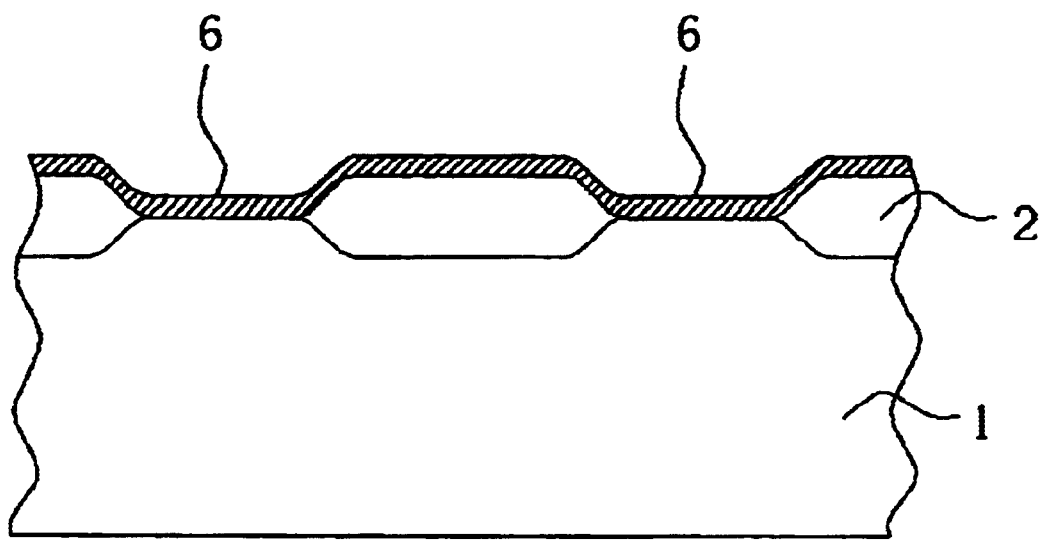
Figure 1C:
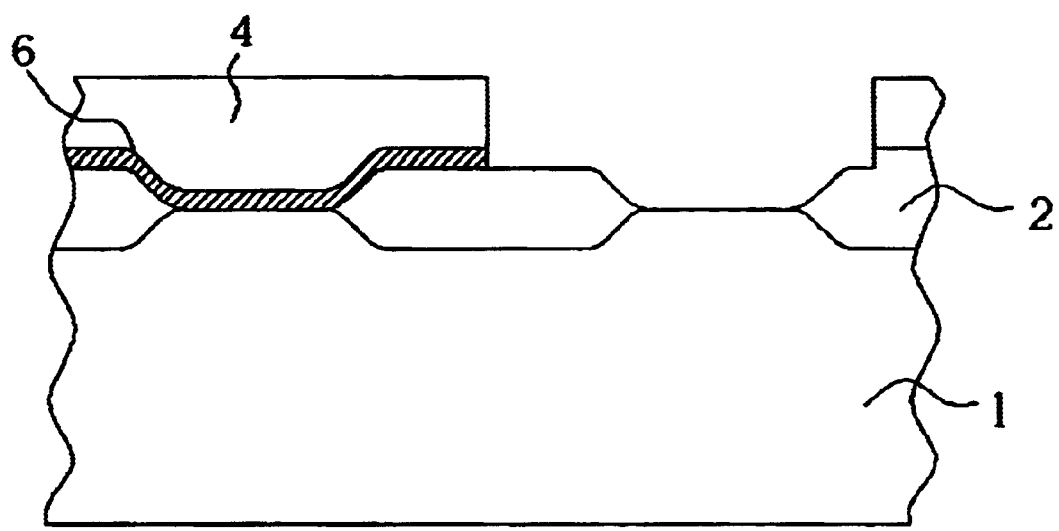
Figure 1D:
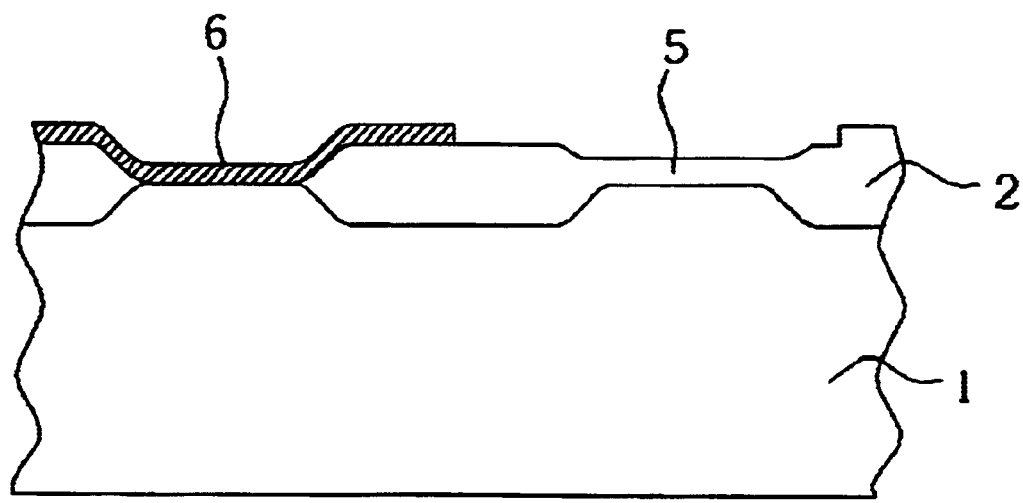
Figure 2A:
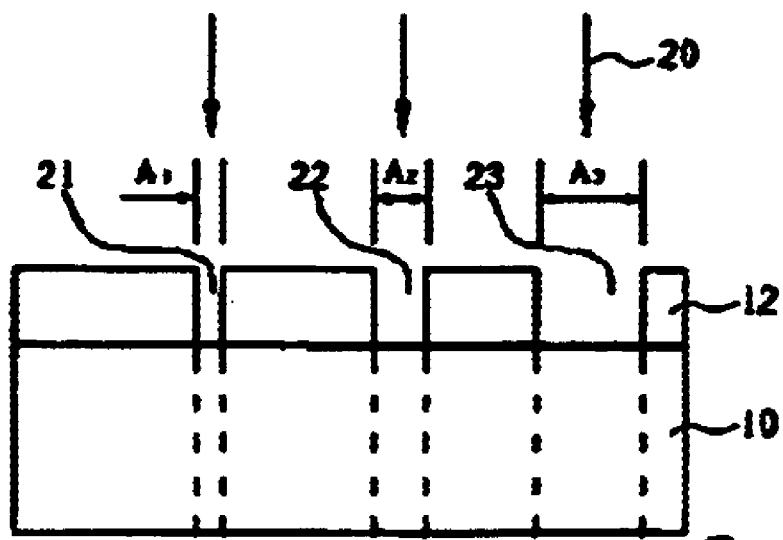
FIG. 2A and FIG. 2B are cross-sectional views of a linear nitrogen doping profile according to the present Invention.
Figure 2B:
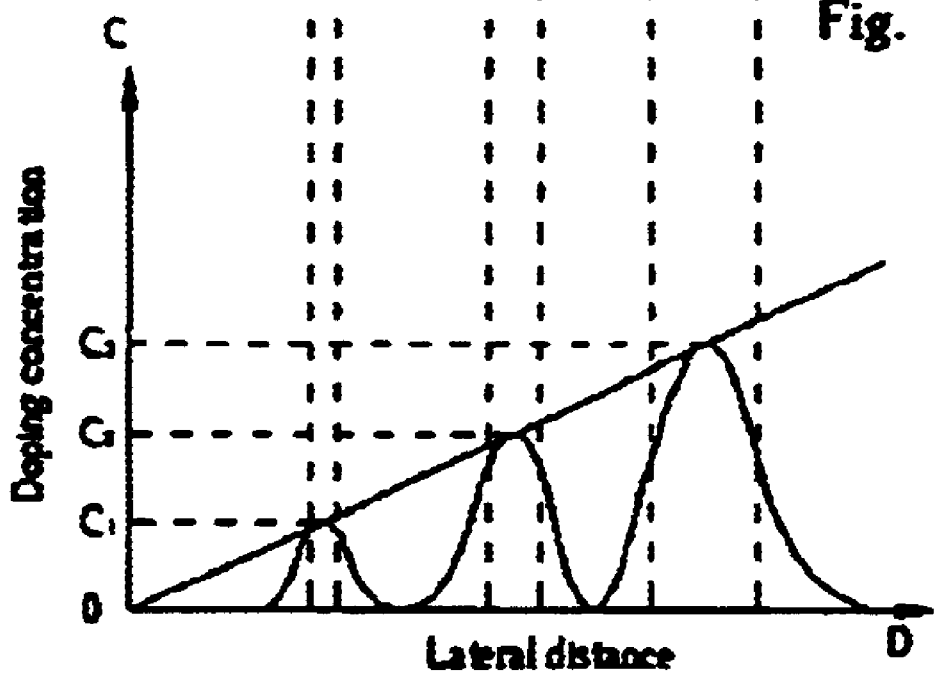

Please refer to FIG. 2A and FIG. 2B of cross-sectional views of a linear nitrogen doping profile according to the present invention. As shown in FIG. 2A, a photoresist layer 12, having openings 21, 22, 23 with surface areas of $A_1$, $A_2$ and $A_3$, respectively, in an increasing order, is formed on a surface of a silicon substrate 10. A nitrogen Ion Implantation process is then performed to obtain a linear distribution of nitrogen ions on the surface of the semiconductor substrate 10. The openings 21, 22 and 23 function to expose portions of the surface of the semiconductor substrate 10 within the openings 21, 22 and 23.

As shown in FIG. 2B, a linear distribution of nitrogen ions on the semiconductor substrate 10 is achieved after performing a thermal annealing process. The x-axis corresponds to a lateral distance of the semiconductor substrate 10, and the y-axis corresponds to the doping concentration of the nitrogen ions. As a result, under a same nitrogen dosage the maximum concentrations $C_1$, $C_2$ and $C_3$ of the nitrogen ions doped into the semiconductor substrate 10 measured by a Secondary ion Mass (SIMS) machine are proportional to the surface areas of $A_1$, $A_2$ and $A_3$. In other words, $A_1:A_2:A_3 = C_1:C_2:C_3$. Besides, the nitrogen ions doped into the semiconductor substrate 10 can curtail the growth rate of the oxide layers. Thus the present invention controls the growth of gate oxide layers and simplifies the manufacturing processes by applying both the linear relationship between the concentration of the nitrogen ions and the surface area of the opening, and the curtailing mechanism of the nitrogen ions.

Please refer to FIG. 3A to FIG. 3D of cross-sectional views of forming multiple oxide layers with different thicknesses on a silicon-on-insulator (SOI) substrate 30 according to the present invention. In the preferred embodiment of the present invention, the SOI substrate 30 is formed by a Separation by Implantation Oxygen (SIMOX) method and comprises a p-type silicon layer, having a thickness ranging from 0.5 to 1 microns, and an insulating layer (not shown). The method of forming the SOI substrate 30 is not the primary object of the present invention and is omitted for simplidty.

An isolating process, such as a localized oxidation on silicon (LOCOS) process, is performed to electrically isolate active areas 36 and 38 of the semiconductor substrate 30 by an insulating layer 32. A sacrificial oxide layer 34, having a thickness ranging from tens to hundreds of angstroms, is formed on both the active areas 36 and 38 of the semiconductor substrate 30. In the preferred embodiment of the present invention, the sacrificial oxide layer 34, having a preferred thickness ranging from 150 to 250 angstroms, is formed by performing a dry thermal oxidation process with an pure oxygen supply at a temperature ranging from 900° C. to 1100° C. The method of the present invention is applied not only on a SOI substrate but also on other semiconductor substrates, including silicon substrates.

Figure 3A:
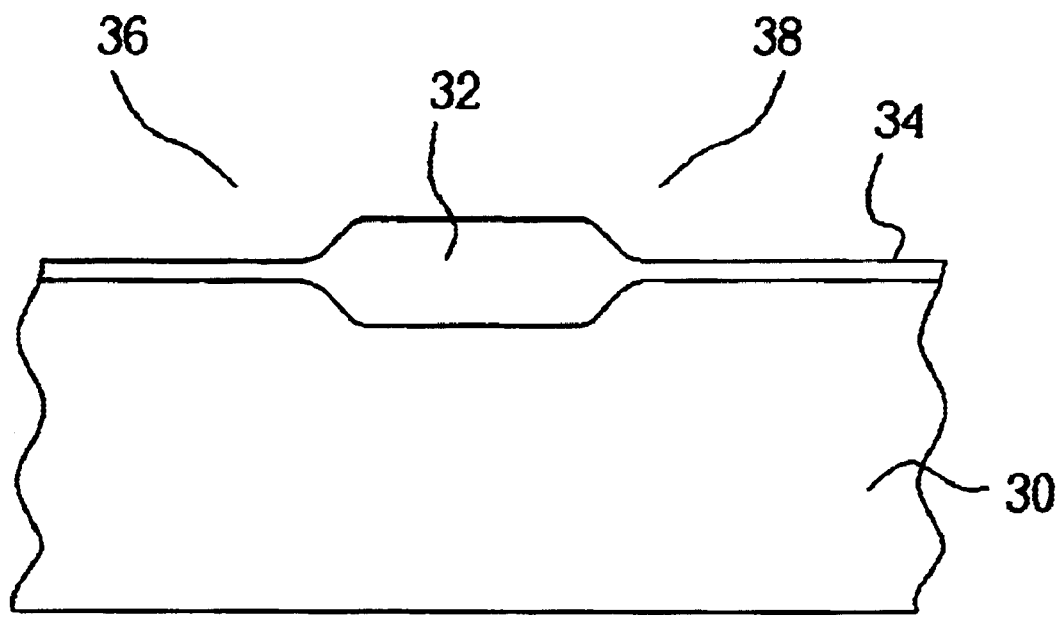
FIG. 3A to FIG. 3D are cross-sectional views of forming multiple oxide layers with different thicknesses on a SOI substrate according to the present invention.
Figure 3B:
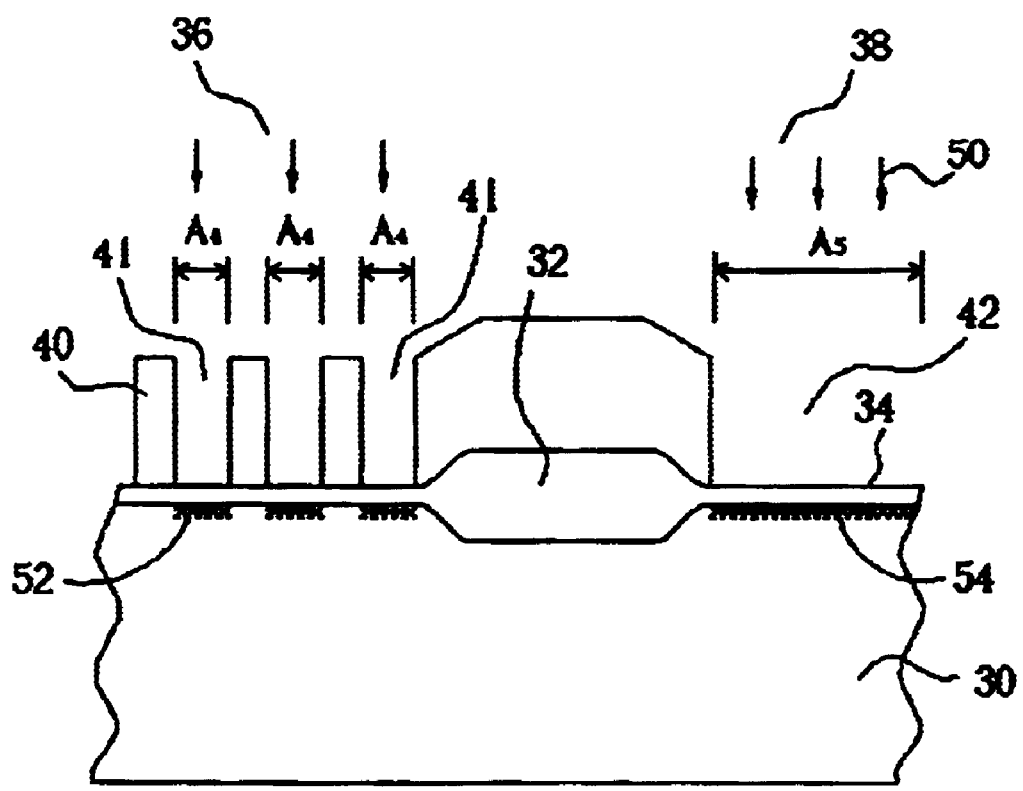

As shown in FIG. 3B, a lithography process is then performed to form a patterned photoresist layer 40 on a surface of the sacrificial oxide layer 34. The photoresist layer 40 comprises multiple openings 41, each having a same surface area of $A_4$, evenly disposed on portions of the sacrificial oxide layer 34 within the active area 36, and an opening 42, having a surface area of $A_5$ to expose the active area 38. Most importantly, the surface area error of the multiple openings 41 need to be precisely controlled so as to obtain a maximum reliability of the product.

A linear nitrogen doping process 50, with a dopant of $N^+$ or $N_2^+$ and an implantation energy ranging from 10 to 40 Kev, is performed to simultaneously implant nitrogen ions into the shallow surface of the semiconductor substrate 30 through the opening 41 and the opening 42 to form a nitrogen ions distribution 52 and a nitrogen ions distribution 54, respectively. The preferred dosage of the nitrogen ions Implantation process, with a preferred duration less than two hours, ranges from $1 \times 10^{14}$ to $1 \times 10^{16}$ cm$^{-2}$ with a preferred implantation energy of ranging from 10 to 30 Kev. The implantation energy of the nitrogen ions is adjusted according to the thickness of the sacrificial oxide layer 34 so as to form the nitrogen ions distributions 52 and 54 close to the surface of the SOI substrate 30. The photoresist layer 40 is then completely removed under an environment with an oxygen plasma supply.

Figure 3C:
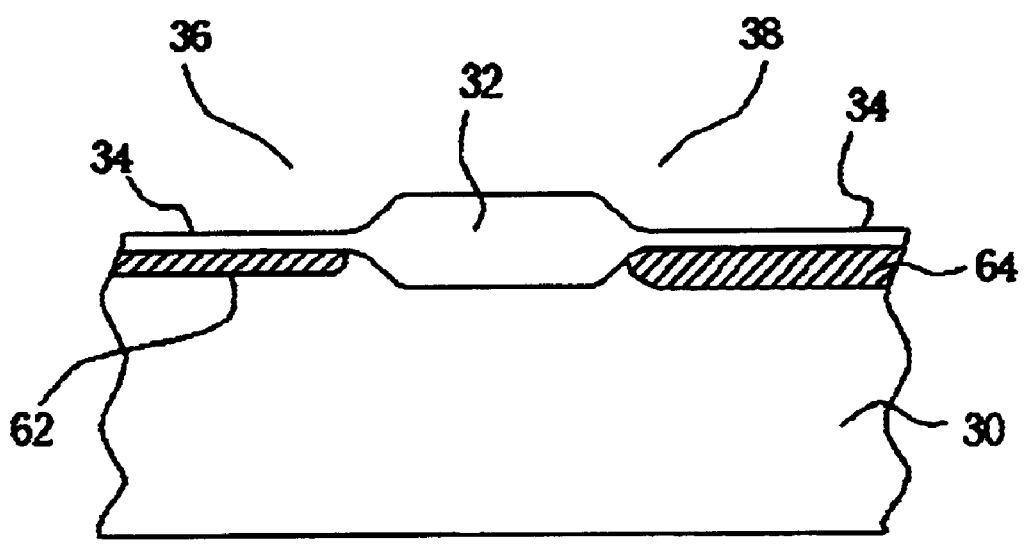

As shown in FIG. 3C, an annealing process, with the duration ranging from 5 to 15 minutes, is performed on the SOI substrate 30 at a temperature of 950° C. so that the doped nitrogen ions dose to the surface of the SOI substrate 30 can horizontally diffuse into the SOI substrate 30. The duration of the annealing process, normally between 1 and 100 minutes, with the operating temperature, normally ranging from 750 to 1100° C. are adjusted according to the dosage of the nitrogen ions and the heating rate of the RTA reactor.

Following the annealing process, a diffusion area 62 of nitrogen ions and a diffusion area 64 are formed in portions of the shallow surface of the SOI substrate 30 close to portions of the sacrificial oxide layer 34 within the active area 36 and portions of the shallow surface of the SOI substrate 30 close to portions of the sacrificial oxide layer 34 within the active area 38, respectively. The concentration of the nitrogen ions within the diffusion area 64 is greater than that of the nitrogen ions within the diffusion area 62. As previously mentioned, both the concentrations of the nitrogen ions in the diffusion areas 62 and 64 are precisely controlled by the surface area of the opening in the photoresist layer 40 during the implantation process of the nitrogen ions. In addition, the dosage of the nitrogen ions doped into the diffusion area 62 is approximately the same as the dosage of the nitrogen ions doped into the diffusion area 64. So the diffusion area 62 has a distributed depth of doped concentration of nitrogen ions similar to a distributed depth of doped concentration of nitrogen ions of the diffusion area 64. For instance, the distributed depth of doped concentration of nitrogen ions ranges from 30 to 50 angstroms from the surface of the SOI substrate 30 as the implantation energy of the nitrogen ions is 30 KeV and the thickness of the sacrificial oxide layer 34 is 200 angstroms.

Figure 3D:
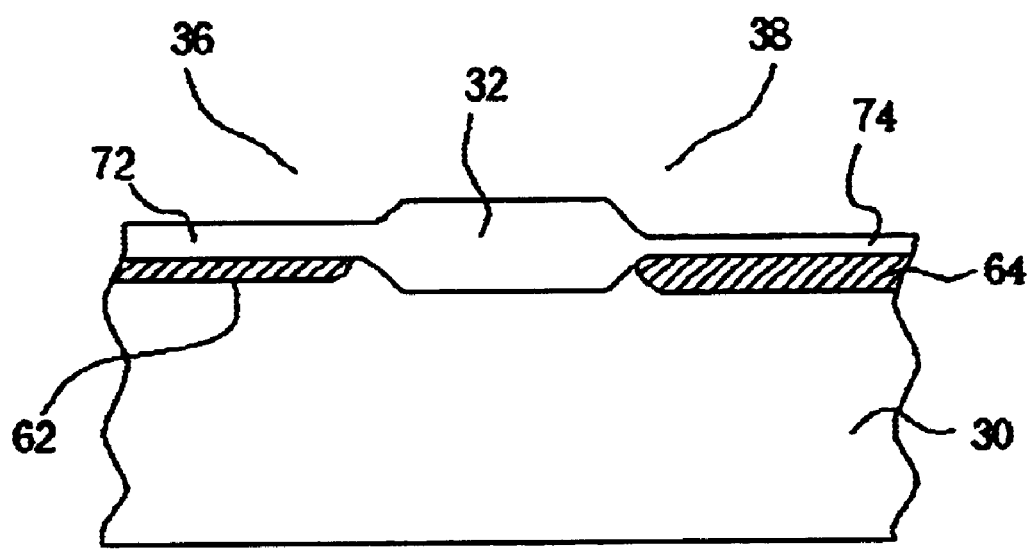

As shown in FIG. 3D, a thermal oxidation process is performed on the SOI substrate 30 at a temperature ranging from 750 to 1000° C. for 10 to 120 minutes in a dry or wet environment to form a gate oxide layer within the active area 36 and a gate oxide layer within the active area 38. The preferred thermal oxidation process is dry oxidation performed at a temperature of 850° C. for approximately 2 hours within a pure oxygen supply. A gate oxide layer 72, having a greater thickness ranging from 20 to 150 angstroms, and a gate oxide layer 74, having a smaller thickness ranging from 20 to 120 angstroms, are thus formed on portions of the SOI substrate 30 within the active area 36 and portions of the SOI substrate 30 within the active area 38, respectively. As previously mentioned, the nitrogen ions doped into the surface of the SOI substrate 30 can depress the oxidation rate of the surface of the SOI substrate 30. Besides, the ability of the nitrogen ions to depress the growth rate of the gate oxide layer relates to the dosage of the nitrogen ions doped into the SOI substrate 30. The thickness of the gate oxide layer is thus controlled by the concentration of the nitrogen ions doped into the SOI substrate 30.

Figure 4A:
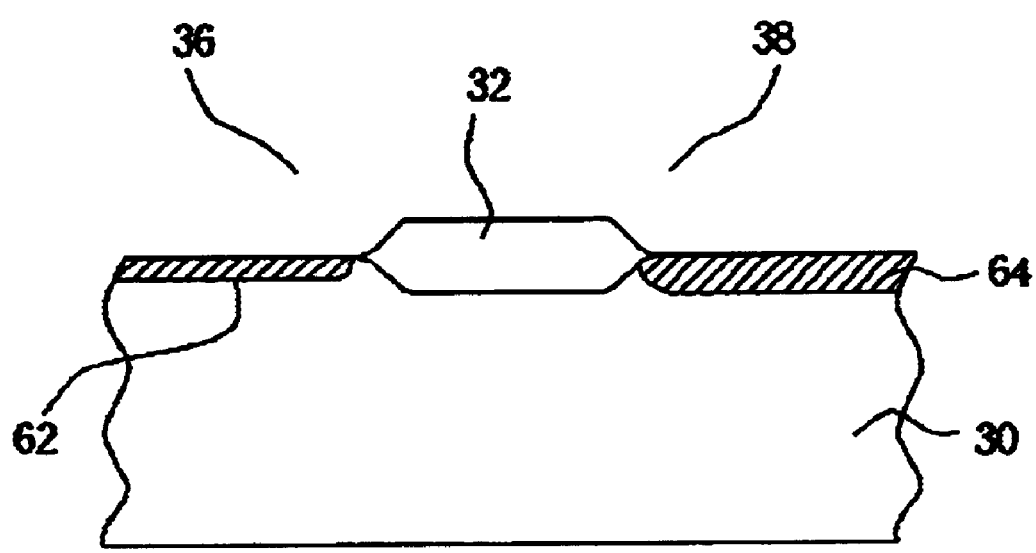
FIG. 4A and FIG. 4B are cross-sectional views of another embodiment of the present invention.
Figure 4B:
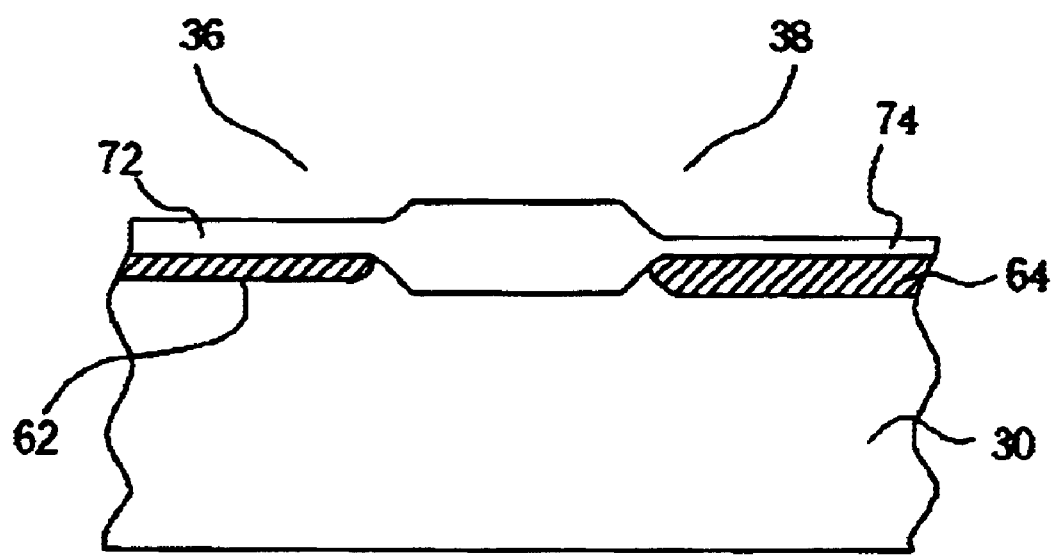

Please refer to FIG. 4A and FIG. 4B of the cross-sectional views of another embodiment of the present invention. The processes prior to removing the photoresist layer 40, including forming the photoresist layer 40, lithography process and the nitrogen ion implantation process 50, are the same as those in the preferred embodiment and are omitted for simplicity. As shown in FIG. 4A, after removing the photoresist layer 40 and performing the nitrogen ion implantation process 50, an annealing process is then performed on the SOI substrate 30 at a temperature of 950° C. for 5 to 15 minutes to reinforce the nitrogen ions doped in the shallow surface of the SOI substrate 30 to horizontally diffuse into the SOI substrate 30 so as to form a diffusion area 62 and a diffusion area 64 in portions of the 501 substrate 30 within the active area 36 and portions of the SOI substrate 30 within the active area 38, respectively. A wet etching process, using diluted hydrofluoric acid as an etching solution, is performed to remove portions of the sacrificial oxide layer 34 within the active area 36 and portions of the sacrificial oxide layer 34 within the active area 38 (not shown).

As shown in FIG. 4B, a thermal oxidation process is performed on the SOI substrate 30 at a temperature ranging from 750 to 1000° C. for 10 to 120 minutes under a dry or wet environment to form a gate oxide layer within the active area 36 and a gate oxide laer within the active area 38. The preferred thermal oxidation process is a dry oxidation process performed at a temperature of 850° C. for approximately 2 hours within a pure oxygen supply. A gate oxide layer 72, having a greater thickness ranging from 20 to 150 angstroms, and a gate oxide layer 74, having a smaller thickness ranging from 20 to 120 angstroms, are formed on portions of the SOI substrate 30 within the active area 36 and portions of the SOI substrate 30 within the active area 38, respectively.

In comparison with the prior art, the present invention has the following advantages in that:(1) only one nitrogen ion implantation process and one thermal oxidation process are needed;(2) multiple gate oxide layers with different thicknesses are simultaneously formed in one thermal oxidation process;(3) different thicknesses of the multiple gate oxide layers can be precisely controlled;(4) the quality of the gate oxide layer formed in the present invention is better than that formed in the prior art; and(5) the manufacturing processes of multiple oxide layers with different thicknesses are significantly simplified.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of forming multiple oxide layers with different thicknesses comprising:

providing a semiconductor substrate comprising a silicon surface with a first region and a second region;

forming a sacrificial oxide layer on the silicon surface to cover both the first region and the second region;

forming a mask layer comprising a first opening with a first predetermined surface area in portions of the mask layer within the first region, and multiple second openings, each second opening having a second predetermined surface area, in portions of the mask layer within the second region, on the surface of the sacrificial oxide layer to respectively expose portions of the sacrificial oxide layer having a surface area equal to the first predetermined surface area, and portions of the sacrificial oxide layer, each having a surface area equal to the second predetermined surface area;

performing a linear nitrogen doping process to simultaneously implant nitrogen ions with a first predetermined concentration and nitrogen ions with a second predetermined concentration into the first region and the second region, respectively, through the first opening and the second opening, respectively;

removing the mask layer;

removing the sacrificial oxide layer; and performing an oxidation process to form a first silicon oxide layer having a first predetermined thickness, and a second silicon oxide layer having a second predetermined thickness, in the first and second regions, respectively.

2. The method of claim 1 wherein the first predetermined surface area is greater than the second predetermined surface area, the first predetermined concentration being greater than the second predetermined concentration, and the first predetermined thickness is less than the second predetermined thickness.

3. The method of claim 1 wherein a ratio of the first predetermined surface area to the second predetermined surface area is defined as a constant k.

4. The method of claim 1 wherein the sacrificial oxide layer has a thickness ranging from 150 to 250 angstroms.

5. The method of claim 1 wherein the semiconductor substrate comprises an SOI substrate.

6. The method of claim 1 wherein the mask layer comprises a photoresist layer.

7. The method of claim 1 wherein the implantation dosage of the nitrogen ions in the linear nitrogen doping process is $N_2^+$ ranging from $1\times10^{14}$ to $1\times10^{16} cm^{-2}$ with an implantation energy of approximately 30 Kev.

* * * * *